United States Patent
Huang et al.

(10) Patent No.: US 11,798,984 B2
(45) Date of Patent: Oct. 24, 2023

(54) SEAMLESS GAP FILL

(71) Applicant: Taiwan Semiconductor Manufacturing Co., Ltd., Hsin-Chu (TW)

(72) Inventors: Yen-Chun Huang, New Taipei (TW); Bor Chiuan Hsieh, Taoyuan (TW); Pei-Ren Jeng, Chu-Bei (TW); Tai-Chun Huang, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/588,478

(22) Filed: Jan. 31, 2022

(65) Prior Publication Data

US 2022/0157934 A1    May 19, 2022

Related U.S. Application Data

(60) Continuation of application No. 16/889,401, filed on Jun. 1, 2020, now Pat. No. 11,239,310, which is a
(Continued)

(51) Int. Cl.
*H01L 29/06* (2006.01)
*H01L 21/02* (2006.01)
(Continued)

(52) U.S. Cl.
CPC ...... *H01L 29/0649* (2013.01); *H01L 21/0217* (2013.01); *H01L 21/0228* (2013.01);
(Continued)

(58) Field of Classification Search
CPC .............. H01L 29/0649; H01L 21/324; H01L 21/76227; H01L 21/02532; H01L 21/0228; H01L 21/0217; H01L 21/0262
See application file for complete search history.

(56) References Cited

U.S. PATENT DOCUMENTS

| 6,046,487 A | 4/2000 | Benedict et al. |
|---|---|---|
| 8,039,179 B2 | 10/2011 | Shieh et al. |
| (Continued) | | |

FOREIGN PATENT DOCUMENTS

| CN | 101246842 | 8/2008 |
|---|---|---|
| CN | 102054740 a | 5/2011 |
| (Continued) | | |

*Primary Examiner* — David Vu
(74) *Attorney, Agent, or Firm* — HAYNES AND BOONE, LLP

(57) ABSTRACT

A method includes depositing a first dielectric layer in an opening, the first dielectric layer comprising a semiconductor element and a non-semiconductor element. The method further includes depositing a semiconductor layer on the first dielectric layer, the semiconductor layer comprising a first element that is the same as the semiconductor element. The method further includes introducing a second element to the semiconductor layer wherein the second element is the same as the non-semiconductor element. The method further includes applying a thermal annealing process to the semiconductor layer to change the semiconductor layer into a second dielectric layer.

20 Claims, 8 Drawing Sheets

Related U.S. Application Data continuation of application No. 16/043,244, filed on Jul. 24, 2018, now Pat. No. 10,672,866, which is a division of application No. 15/290,772, filed on Oct. 11, 2016, now Pat. No. 10,084,040.

(60) Provisional application No. 62/273,209, filed on Dec. 30, 2015.

(51) Int. Cl.
  *H01L 21/324* (2006.01)
  *H01L 21/762* (2006.01)
  *H01L 29/66* (2006.01)

(52) U.S. Cl.
  CPC .... *H01L 21/0262* (2013.01); *H01L 21/02532* (2013.01); *H01L 21/324* (2013.01); *H01L 21/76227* (2013.01); *H01L 29/66795* (2013.01)

(56) References Cited

U.S. PATENT DOCUMENTS

| | | | |
|---|---|---|---|
| 8,202,681 B2 | 6/2012 | Lin et al. | |
| 8,728,332 B2 | 5/2014 | Lin et al. | |
| 8,822,243 B2 | 9/2014 | Yan et al. | |
| 9,184,086 B2 | 11/2015 | Park et al. | |
| 9,812,319 B1 | 11/2017 | Fukazawa et al. | |
| 2006/0091468 A1 | 5/2006 | Liaw | |
| 2008/0305609 A1 | 12/2008 | Shih | |
| 2010/0012912 A1 | 1/2010 | Schricker et al. | |
| 2010/0304548 A1 | 12/2010 | Turner et al. | |
| 2011/0281208 A1 | 11/2011 | Lin et al. | |
| 2012/0100722 A1 | 4/2012 | Asai et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0227856 A1 | 8/2014 | Park et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2015/0255324 A1 | 9/2015 | Li et al. | |
| 2016/0027876 A1 | 1/2016 | Lee et al. | |
| 2017/0062204 A1 | 3/2017 | Suzuki et al. | |
| 2017/0194424 A1 | 7/2017 | Huang et al. | |
| 2018/0350906 A1 | 12/2018 | Huang et al. | |
| 2020/0295131 A1 | 9/2020 | Huang et al. | |

FOREIGN PATENT DOCUMENTS

| CN | 103594413 | 2/2014 |
|---|---|---|
| CN | 104779195 | 7/2015 |

US 11,798,984 B2

SEAMLESS GAP FILL

PRIORITY INFORMATION

The present application is a continuation application of U.S. application Ser. No. 16/889,401, filed Jun. 1, 2020, which is a continuation application of U.S. application Ser. No. 16/043,244, filed Jul. 24, 2018, which is a divisional application of U.S. patent application Ser. No. 15/290,772, filed Oct. 11, 2016, which claims the benefit of U.S. Provisional Application No. 62/273,209, filed Dec. 30, 2015, the disclosure of each of which is hereby incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Semiconductor device fabrication includes many different processes, each process having associated cycle-time and cost requirements. It is a continued desire to reduce cost and cycle-time in device fabrication. Further, it is a continued desire to reduce the number of defects and improve yields in semiconductor fabrication. The present disclosure provides improvements that relate to the fabrication of such devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
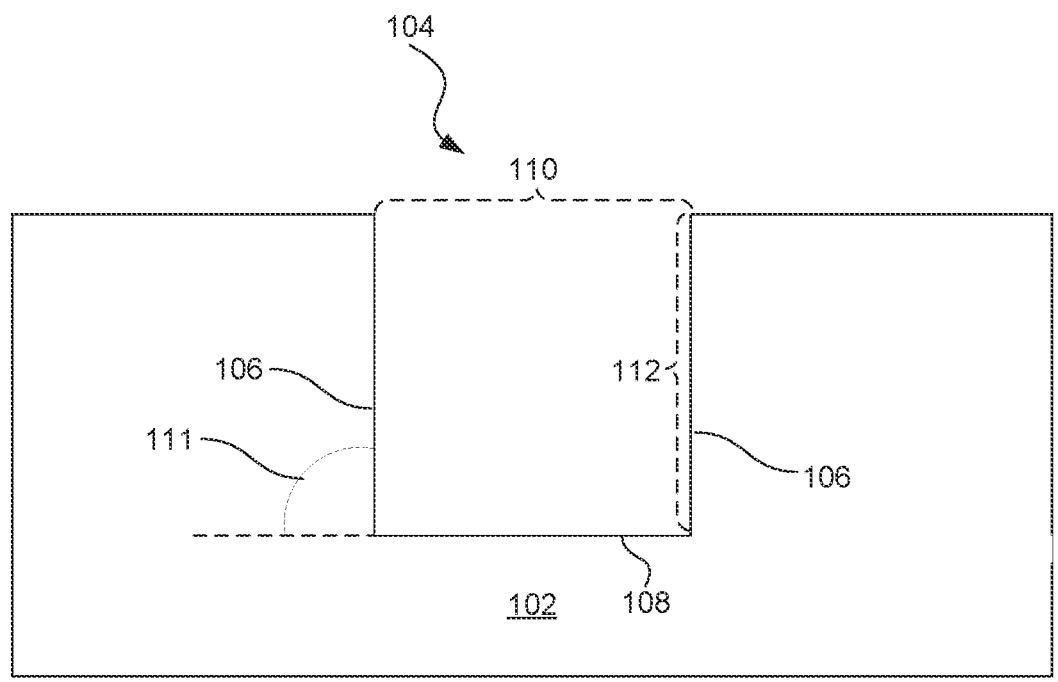
FIG. 1A is a diagram showing an illustrative opening in a substrate, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the fabrication of semiconductor devices, it is often desirable to fill small openings (such as a trench) with a dielectric material such as silicon nitride or other semiconductor compound material. Such openings are typically filled by applying a deposition process to fill the opening. Then, a Chemical Mechanical Polishing (CMP) process is applied to remove excess material. But, this process typically leaves a gap within the opening.

Specifically, the deposition processes build up material horizontally (on sidewalls of the opening) and vertically (on the bottom surface of the opening and top surface of the substrate outside the opening). As material is built up on the sidewalls and the bottom surface of the opening, a point is reached at which material is no longer formed horizontally. This results in a gap within the opening. It is desirable that this gap be avoided.

Accordingly, methods described herein provide a technique for reducing or eliminating the gap in the opening. In one example, a deposition process, such as Atomic Layer Deposition (ALD), is used to deposit a dielectric semiconductor compound material (e.g., silicon nitride) over an opening to fill that opening. As described above, this often leaves a gap within the opening. Then, a semiconductor layer (e.g., silicon) is deposited onto the semiconductor compound material. Then, the other element of the semiconductor compound is introduced into the semiconductor material. In the example where the semiconductor compound is silicon nitride, and the semiconductor layer is silicon, then nitrogen is introduced into the semiconductor layer. The nitrogen may be introduced, for example, by an implantation process. Alternatively, the nitrogen may be introduced by passing nitrogen gas over the surface of the semiconductor layer. Then, an annealing process is performed. The annealing process will cause the semiconductor material and the other element to form additional semiconductor compound material to fill the gap.

Using principles described herein, the quality of dielectric material deposited into relatively small openings is improved. In other words, gaps within such dielectric fills can be substantially reduced or eliminated. This improves the yield for the semiconductor fabrication processes involved in forming devices with dielectric material into relatively small openings.

FIG. 1A is a diagram showing an illustrative opening 104 in a substrate 102. The opening 104 has a higher aspect ratio, such as greater than 5. As will be described in further detail below, the opening 104 may be, for example, a trench 104 between fin structures. In such a case, the material used to fill the opening 104 is used to form a Shallow Trench Isolation (STI) region. In some examples, the opening 104 is a contact hole, in a dielectric material layer, used to expose an underlying feature such as a source/drain region or a gate structure.

The substrate 102 may include a single material or may include a variety of materials. In the example where the opening 104 is used to separate fin structures, the substrate 102 may include a single semiconductor material such as silicon. In the example where the opening 104 exposes an underlying feature, the substrate 102 may include a variety of materials such as a semiconductor material, a doped semiconductor material, gate stack materials, and Interlayer Dielectric (ILD) materials. Such materials may form various patterns that together form integrated circuit components such as transistors.

In one example, the opening 104 has a width 110 of approximately 20 nanometers. In some examples, the width is less than 20 nanometers. The aspect ratio (i.e., the ratio of height 112 to width 110) may be approximately five. In some examples, the aspect ratio is greater than five. In one example, the angle 111 between the bottom surface 108 of the opening 104 and the sidewall surfaces 106 of the opening 104 is within a range of about 87-93 degrees.

Figure 1B:
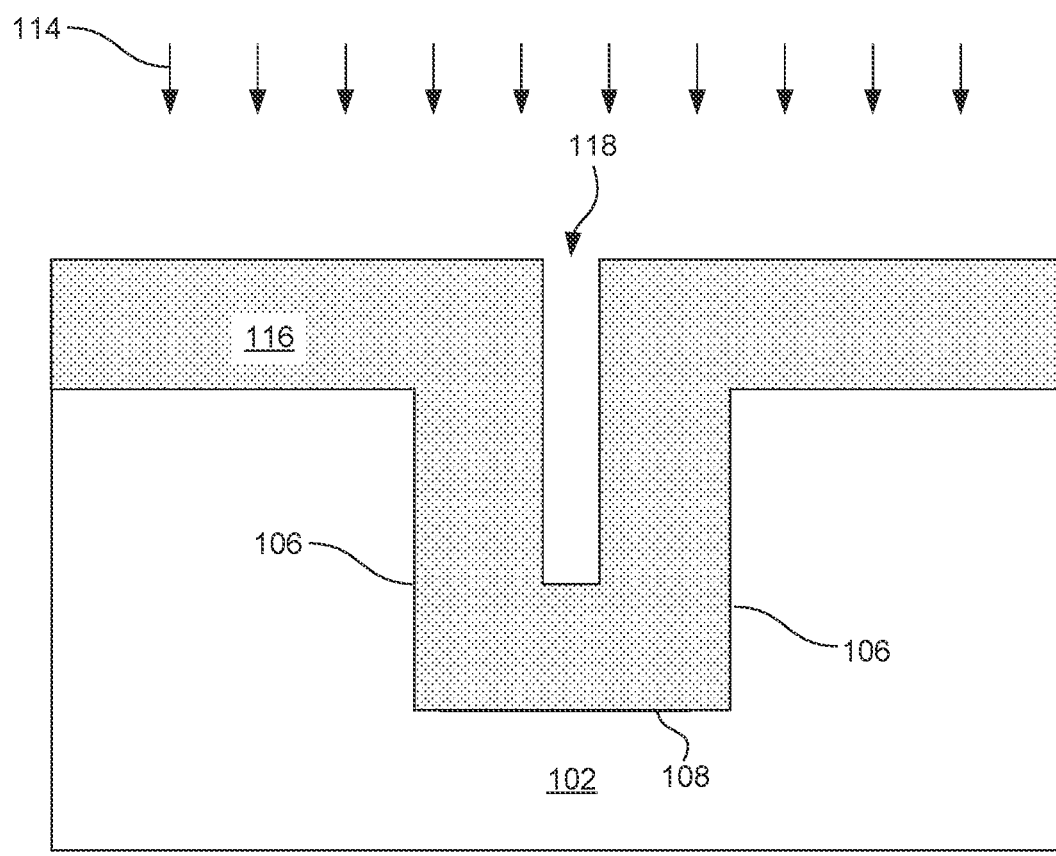
FIG. 1B is a diagram showing an illustrative process for depositing a semiconductor compound material to fill the opening, according to one example of principles described herein.

FIG. 1B is a diagram showing an illustrative process 114 for depositing a first dielectric layer 116 deposited within the opening 104. Specifically, the first dielectric layer 116 is deposited on top of the substrate 102, on the sidewalls 106 of the opening, and on the bottom surface 108 of the opening 104. Deposition of the first dielectric layer 116 leaves a gap 118 positioned near the center of the opening 104.

The deposition process 114 may be one of a variety of deposition processes. In one example, the deposition process 114 is an ALD process. ALD involves a chemical reaction of precursors. Specifically, a substrate is exposed to alternating gaseous species to deposit thin layers of material onto a substrate. Another example of a deposition process that may be used is a Chemical Vapor Deposition (CVD) process such as a Low Pressure CVD (LPCVD) process. A CVD process also involves the use of precursors that are exposed to the substrate. A chemical reaction causes material to be deposited onto the substrate. An LPCVD process is performed at sub-atmospheric pressures.

The first dielectric layer 116 may be one of a variety of materials that includes both a semiconductor material and a second, non-semiconductor material. The second material will be referred to as the secondary material. In some examples, the semiconductor material may be one of silicon (Si), germanium (Ge), or a III-V semiconductor material. In one example, the secondary material may be oxygen, nitrogen, or both. Accordingly, the first dielectric layer 116 may be a dielectric material such as silicon nitride (SiN), silicon oxide (SiO), or silicon oxynitride (SiON). Other dielectric semiconductor compound materials are contemplated.

In one example, the gap 118 has a width within a range of about 1 to 5 nanometers. This gap may be difficult to fill by continuing the deposition of the first dielectric layer 116. For example, continued deposition of the first dielectric layer 116 may close the gap at the top, thus preventing further deposition at lower points. This may leave a space, or gap, within the center of the opening. It is desirable that this gap be filled.

Figure 1C:
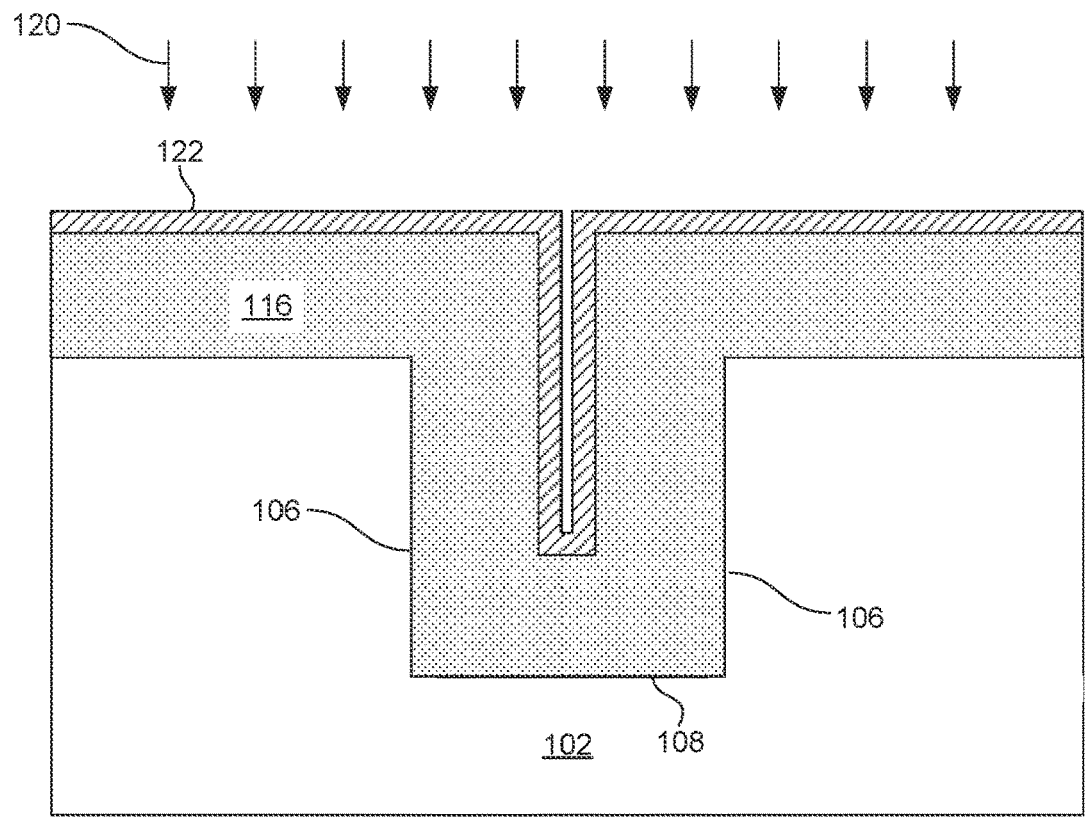
FIG. 1C is a diagram showing an illustrative process for forming a semiconductor layer on the semiconductor compound material, according to one example of principles described herein.

FIG. 1C is a diagram showing an illustrative deposition process 120 for forming a semiconductor layer 122 on the first dielectric layer 116. The semiconductor layer 122 may be deposited using a deposition process such as ALD or LPCVD. The semiconductor layer 122 is made of the same semiconductor material that is in the first dielectric layer 116. For example, if the first dielectric layer 116 is silicon nitride, then the semiconductor layer 122 is made of silicon.

Figure 1D:
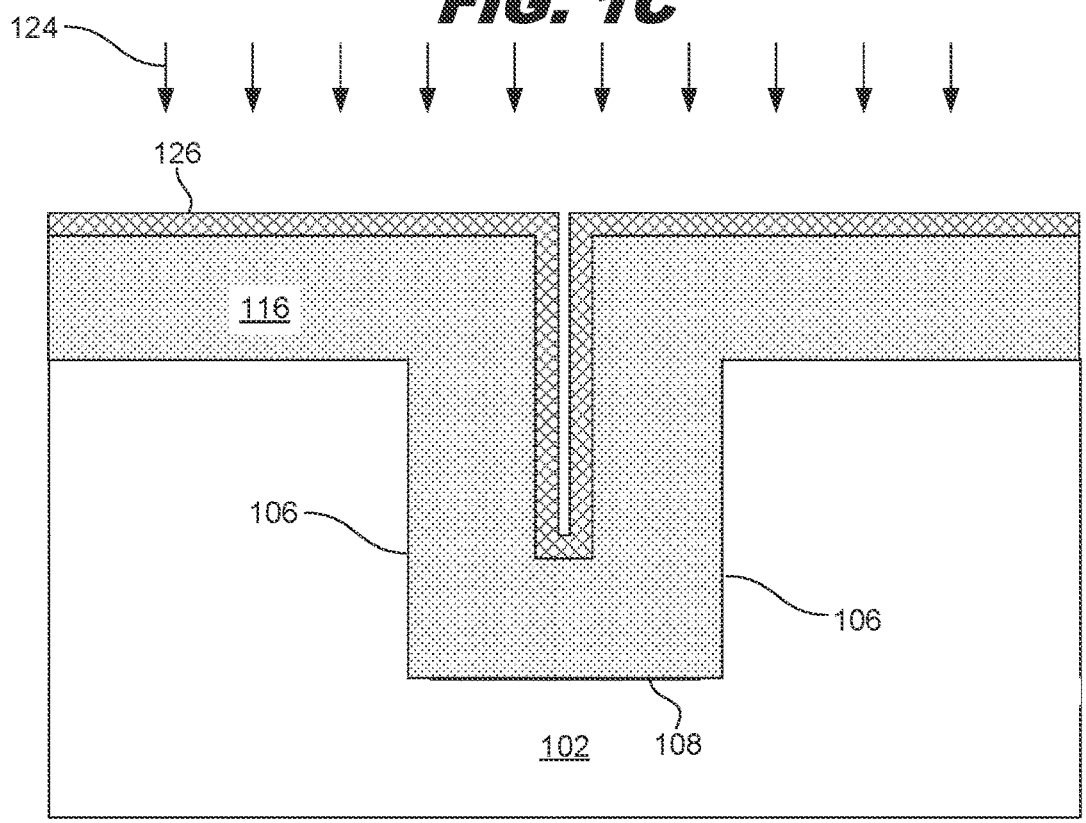
FIG. 1D is a diagram showing an illustrative process for applying an implantation process on the semiconductor layer, according to one example of principles described herein.

FIG. 1D is a diagram showing an illustrative process for applying an implantation process 124 on the semiconductor layer 122. An implantation process involves the driving of ions into a substrate (particularly, the semiconductor layer 122) so that the ions become lodged in the substrate. For example, if the first dielectric layer 116 is silicon nitride, then the implantation process may involve the implantation of nitrogen. If the first dielectric layer 116 is silicon oxide, then the implantation process 124 may involve the implantation of oxygen. If the first dielectric layer 116 is silicon oxynitride, then the implantation process 124 may involve the implantation of both oxygen and nitrogen.

The implantation process 124 may serve a variety of purposes for principles described herein. In one example, the implantation process 124 may make the semiconductor layer 122 an amorphous semiconductor layer 126. Unlike the original semiconductor layer 122 which may have a crystal structure, the amorphous semiconductor layer 126 has no such crystal structure. In other words, the implantation process 124 breaks down the crystal structure of the semiconductor layer 122. This will aid the process of transforming the amorphous semiconductor layer 126 into the a second dielectric layer similar to the first dielectric layer 116 during the annealing process as will be described in further detail below.

Additionally, the implantation process 124 may introduce a non-semiconductor element such as nitrogen into the semiconductor layer 122. The non-semiconductor element introduced through the implantation process may be the same as the non-semiconductor element of the first dielectric layer 112. For example, if the first dielectric layer 116 is silicon nitride, then the implantation process 124 may be used to introduce nitrogen into the semiconductor layer 122. In another example, if the first dielectric layer 116 is silicon oxide, then the implantation process 124 may be used introduce oxygen into the semiconductor layer 122. In a further example, if the first dielectric layer 116 is silicon oxynitride, then the implantation process 124 may be used introduce both oxygen and nitrogen into the semiconductor layer 122.

Figure 1E:
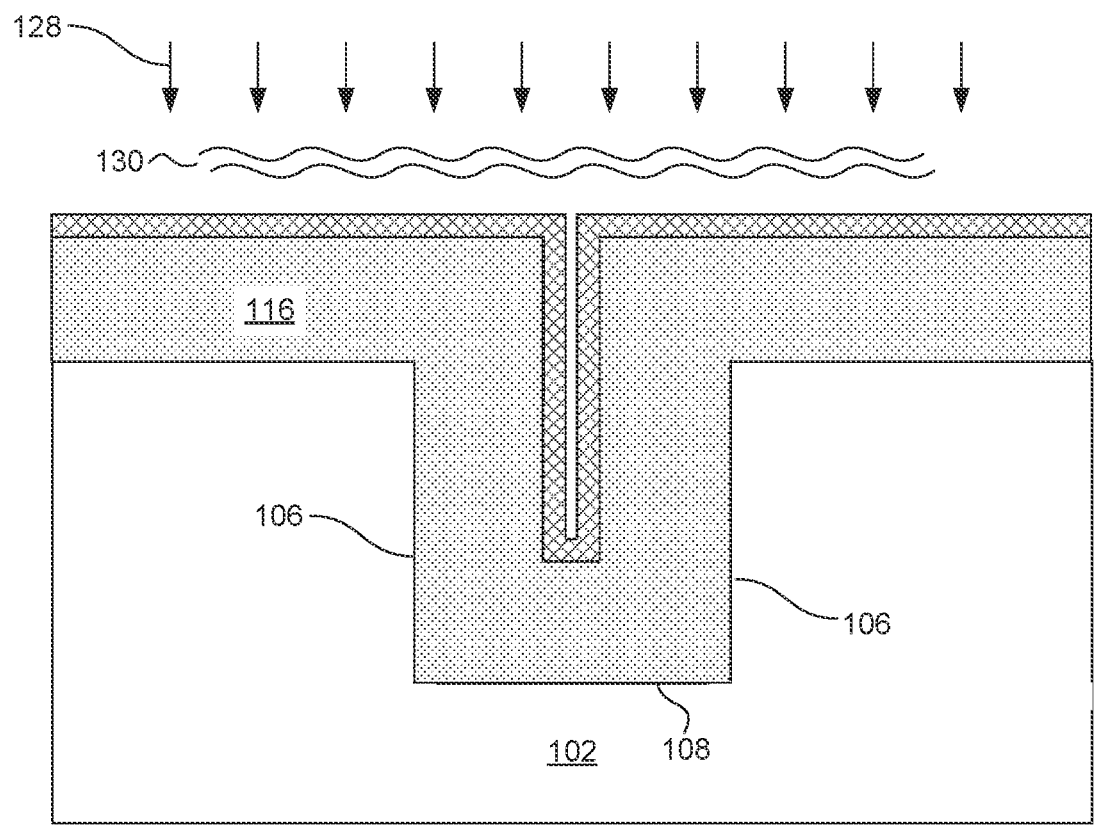
FIG. 1E is a diagram showing an illustrative process for applying an annealing process, according to one example of principles described herein.

FIG. 1E is a diagram showing an illustrative process for applying an annealing process 128. The annealing process 128 is a thermal annealing. An annealing process involves the application of a high temperature for a specified period of time. In one example, the annealing process 128 may apply a temperature of 950° C. for at least 30 minutes. The annealing process 128 is designed to transform the semiconductor layer 122 or amorphous semiconductor layer 126 into the first dielectric layer 116.

In some examples, while the annealing process is being performed, additional material comprising the second element may be applied by passing gas 130 containing the second element over the substrate. For example, if the first dielectric layer 116 is silicon nitride, then the gas 130 may include nitrogen gas. If the first dielectric layer 116 is silicon oxide, then the gas 130 may include oxygen. If the first dielectric layer 116 is silicon oxynitride, then the gas 130 may include both oxygen and nitrogen.

In some examples, the additional material that includes the non-semiconductor element corresponding to the non-semiconductor element of the first dielectric layer 116 may be introduced only through the implantation process 124. In some examples, the non-semiconductor element corresponding to the non-semiconductor element of the first dielectric layer 116 may be introduced only through the gas 130 during the annealing process 128. In some examples, the non-semiconductor element corresponding to the non-semiconductor element of the first dielectric layer 116 may be introduced through both the implantation process 124 and gas 130 during the annealing process 128.

Figure 1F:
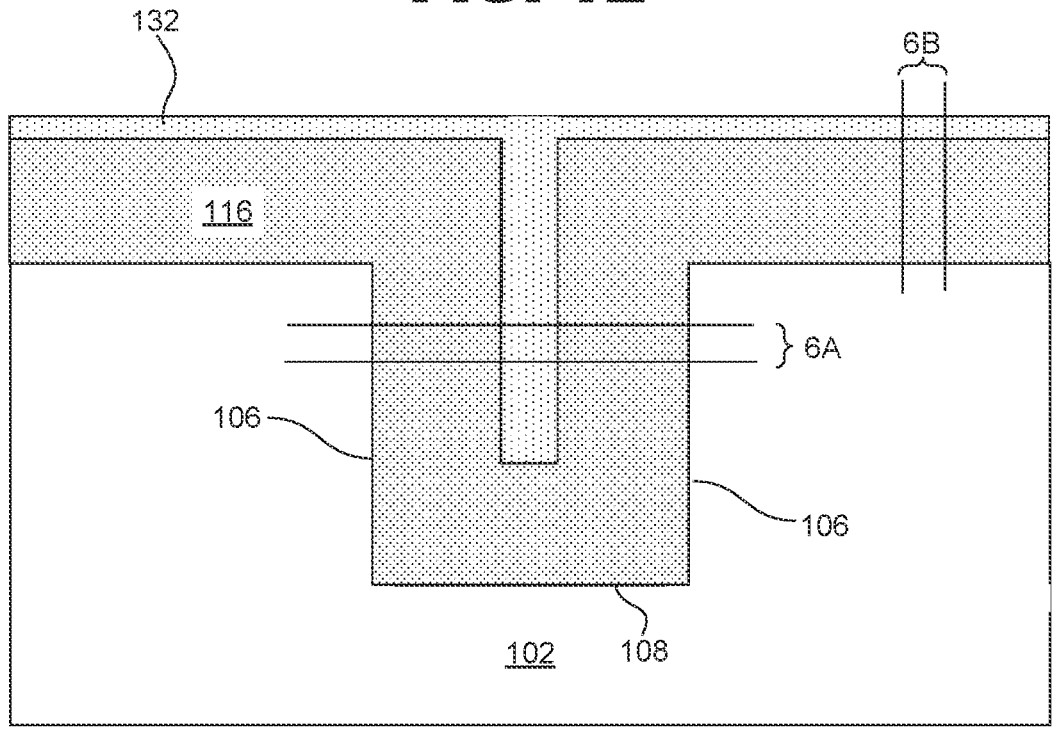
FIG. 1F is a diagram showing an illustrative seamless fill, according to one example of principles described herein.

FIG. 1F is a diagram showing an illustrative seamless fill. According to the present example, after the annealing process 128 the semiconductor layer 122 has been transformed into a second dielectric layer 132 made of similar materials as the first dielectric layer 116. Thus, there is no gap in the center of the filled opening 104. Fabrication of the integrated circuit may then continue. For example, a CMP process may be used to remove portions of the second dielectric layer 132 to expose the substrate 102. Then, an etching process may be used to partially remove the single second dielectric layer 132 of the upper portion of the opening 104.

Using principles described herein, the quality of dielectric material deposited into relatively small openings is improved. In other words, gaps within such dielectric fills can be substantially reduced or eliminated. This improves the yield for the semiconductor fabrication processes involved in forming devices with dielectric material into relatively small openings.

Figure 2:
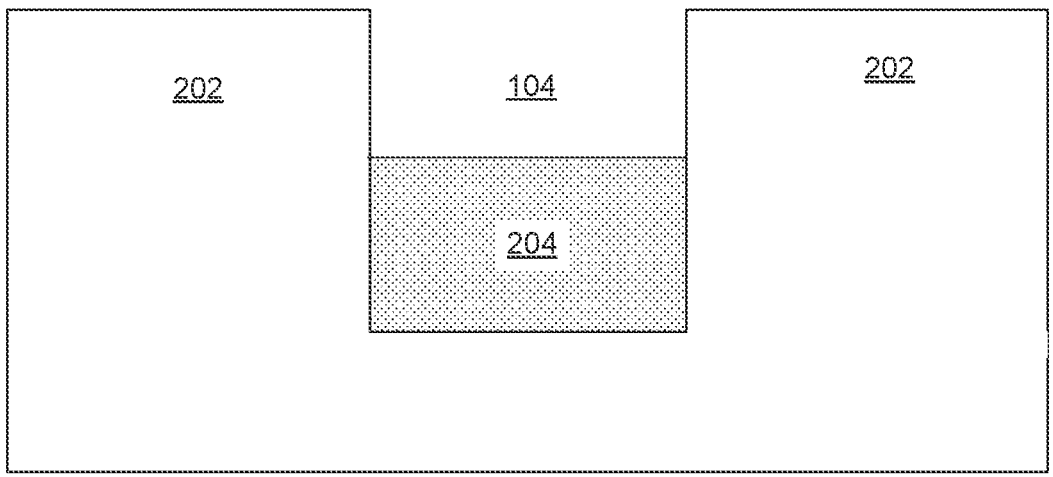
FIG. 2 is a diagram showing an illustrative seamless fill for an opening between fin structures, according to one example of principles described herein.

FIG. 2 is a diagram showing an illustrative seamless fill for an opening between fin structures. As described above, the opening 104 may be an opening used for a variety of situations. In one example, the opening 104 corresponds to a space between fin structures 202. The fin structures may be formed by patterning semiconductor substrate. Specifically, portions of the semiconductor substrate may be removed such that the remaining portions form the fin structures. In some examples, it is desirable to form STI regions between the fin structures. Using conventional deposition processes to form such STI features may result in a gap as described above. But, using principles described herein the STI region 204 may be formed without such a gap.

Figure 3:
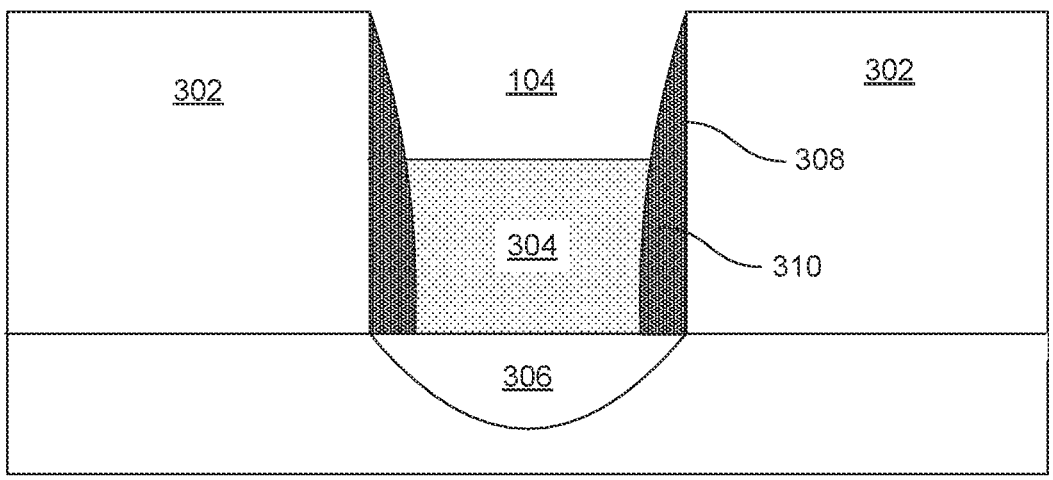
FIG. 3 is a diagram showing an illustrative seamless fill in which the opening exposes a source/drain region, according to one example of principles described herein.

FIG. 3 is a diagram showing an illustrative seamless fill in which the opening 104 exposes a source/drain region 306. The opening 104 may be positioned between two gate structures 302. In some examples, the opening 104 is created to expose the source/drain region 306 so as to fill that opening with a metal material to form a contact. The sidewalls 308 of the gate structures 302 may have dielectric gate spacers 310 formed thereon to electrically insulate the gate structures 302 from a metal contact that is to be formed in the opening 104. Before the metal contact is formed, a temporary dielectric material may be formed within the opening 104 to act as an etch stop layer 304. The etch stop layer 304 may protect the source/drain region 306 from various other fabrication processes. The etch stop layer 304 may then be removed before the metal contact is formed. Using principles described herein, the etch stop layer 304 does not have a gap and thus there is less risk that etchants may undesirably reach the underlying source/drain region 306.

Figure 4:
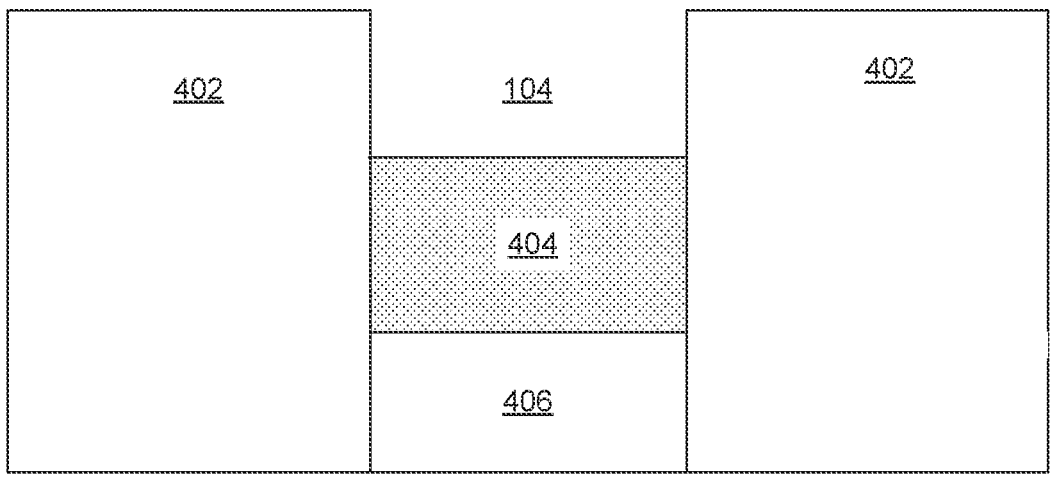
FIG. 4 is a diagram showing an illustrative seamless fill in which the opening exposes a gate structure, according to one example of principles described herein.

FIG. 4 is a diagram showing an illustrative seamless fill in which the opening 104 exposes a gate structure 406. In some cases, an ILD layer 402 is formed over the gate structure 406. Then, an etching process is used to expose the opening 104 so that a metal material may be filled into the opening 104 to form a gate contact. But, before the metal gate contact is formed, a temporary dielectric material may be formed within the opening 104 to act as an etch stop layer 404. The etch stop layer 404 may protect the gate structure 406 from various other fabrication processes and removed after such processes are complete. Using principles described herein, the dielectric etch stop layer 404 will not have a gap and thus there is less risk that etchants may undesirably reach the underlying gate structure 406.

While FIGS. 2-4 illustrate a number of scenarios in which principles described herein may be used, other scenarios in which a dielectric layer is deposited into a relatively small opening may also benefit from principles described herein. For example, in situations where the ratio of height to width of the opening is greater than 5 and the width of the opening is approximately 20 nanometers or less may benefit from using principles described herein. By using principles described herein, weak seams may be reduced or eliminated, yield may be improved, and the overall quality of the dielectric layer formed within the opening is improved.

Figure 5:
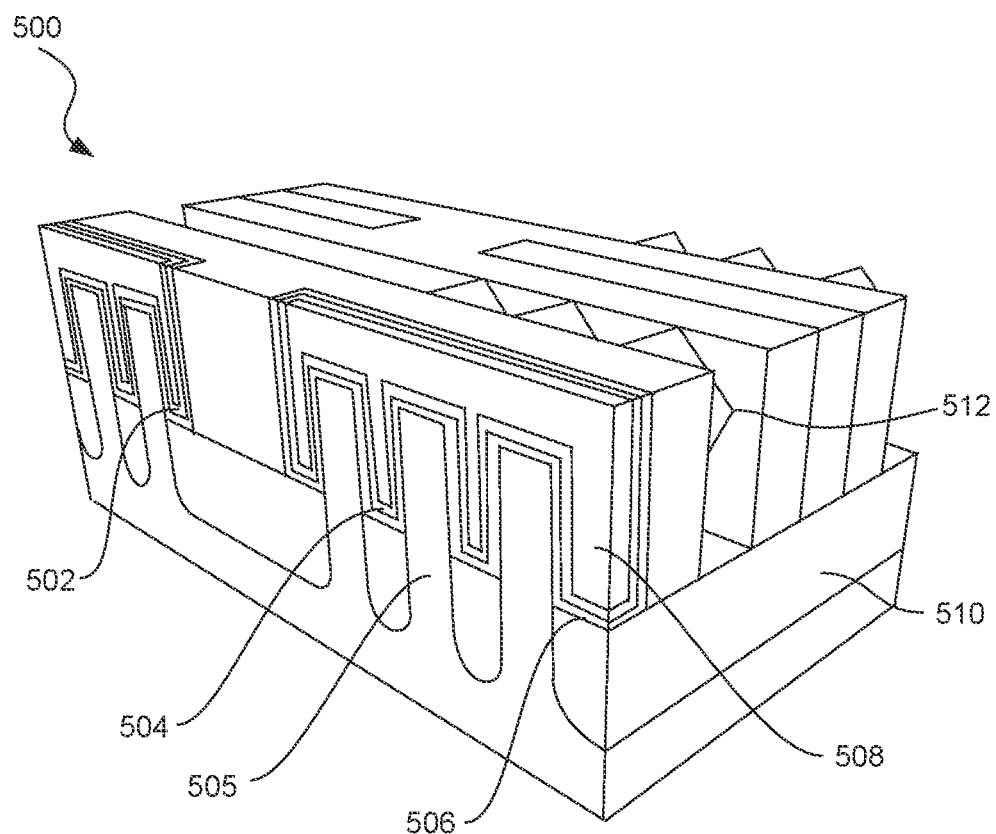
FIG. 5 is a diagram showing illustrative STI structures formed using a seamless gap fill method, according to one example of principles described herein.

FIG. 5 is a diagram showing illustrative STI structures formed using a seamless gap fill method. FIG. 5 illustrates a perspective view of a finFET device 500. The finFET device includes a number of fin structures 505 separated by STI structures 510. The STI structures 510 may be formed using the seamless gap fill method described herein. Then, the STI regions may be etched down to the desired height. Due to the use of the seamless gap fill method, there is no gap in the center of the STI regions 510. A gate stack is disposed over the fin structures 505. The gate stack may include a high-k dielectric layer 506, an N-metal 502 or a p-metal 504, and a metal layer 508. The gate stack forms a gate device with a width 512.

Figure 6A:
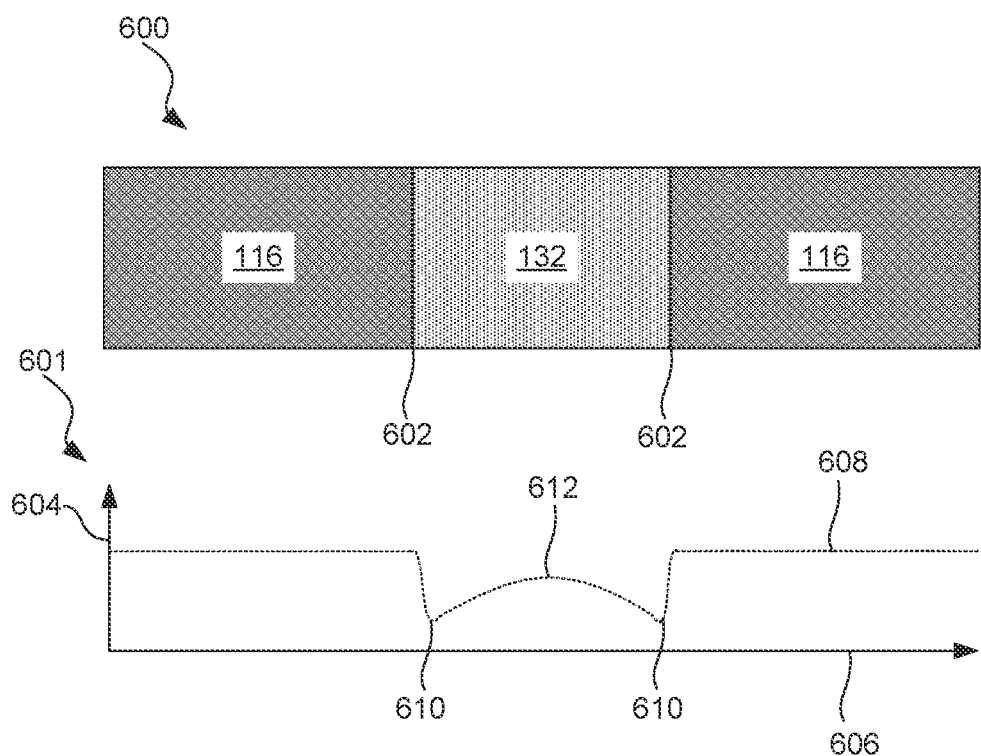
FIGS. 6A and 6B are diagrams showing doping profiles of the seamless gap fill, according to one example of principles described herein.
Figure 6B:
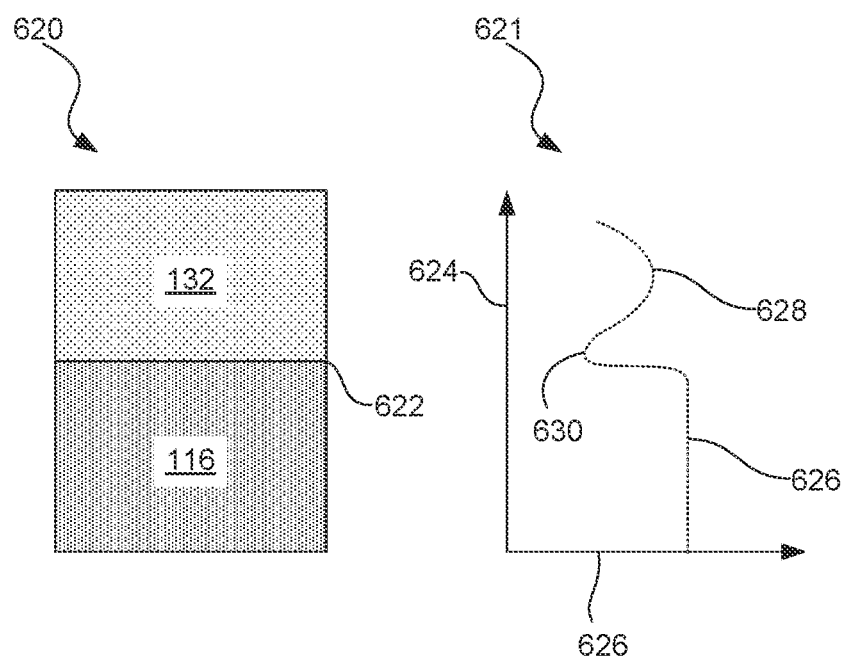

FIGS. 6A and 6B are diagrams showing concentration profiles of the seamless gap fill. The first dielectric layer 116 and the second dielectric layer 132 have similar materials, but the ratio between those materials may be different.

Specifically, the ratio between the semiconductor element and the non-semiconductor element may be different between the two dielectric layers 116, 132. For example, there may be a higher concentration of the non-semiconductor element in the second dielectric layer 132 than in the first dielectric layer 116.

FIG. 6A is a diagram showing a concentration profile 601 along a horizontal cross-section 600 of the dielectric layers 116, 132. The cross-section is along section 6A shown in FIG. 1F. The vertical axis 604 represents concentration of the non-semiconductor element (e.g., nitrogen) within the semiconductor element (e.g., silicon). The horizontal axis 606 represents position.

The concentration profile 601 shows a drop 610 in concentration at the interfaces 602 between the first dielectric layer 116 and the second dielectric layer 132. In other words, the concentration of the non-semiconductor element in the first dielectric layer 116 is greater than the concentration of the non-semiconductor element in the second dielectric layer 132. Additionally, within the second dielectric layer 132, the concentration of the non-semiconductor element increases toward the center of the second dielectric layer to peak 612. In one example, the ratio of non-semiconductor element to semiconductor element in the first dielectric layer 116 is 4:3. The ratio of non-semiconductor element to semiconductor element in the second dielectric layer 132 may be less than that.

FIG. 6B is a diagram showing a concentration profile 601 along a vertical cross-section 620 of the dielectric layers 116, 132. The cross-section 620 is along section 6B shown in FIG. 1F. The vertical axis 624 represents position. The horizontal axis 626 represents concentration of the non-semiconductor element (e.g., nitrogen) within the semiconductor element (e.g., silicon).

The concentration profile 621 shows a drop 630 in concentration at the interface 622 between the first dielectric layer 116 and the second dielectric layer 132. In other words, the concentration of the non-semiconductor element in the first dielectric layer 116 is greater than the concentration of the non-semiconductor element in the second dielectric layer 132. Additionally, within the second dielectric layer 132, the concentration of the non-semiconductor element increases toward the center of the second dielectric layer to peak 628.

Figure 7A:
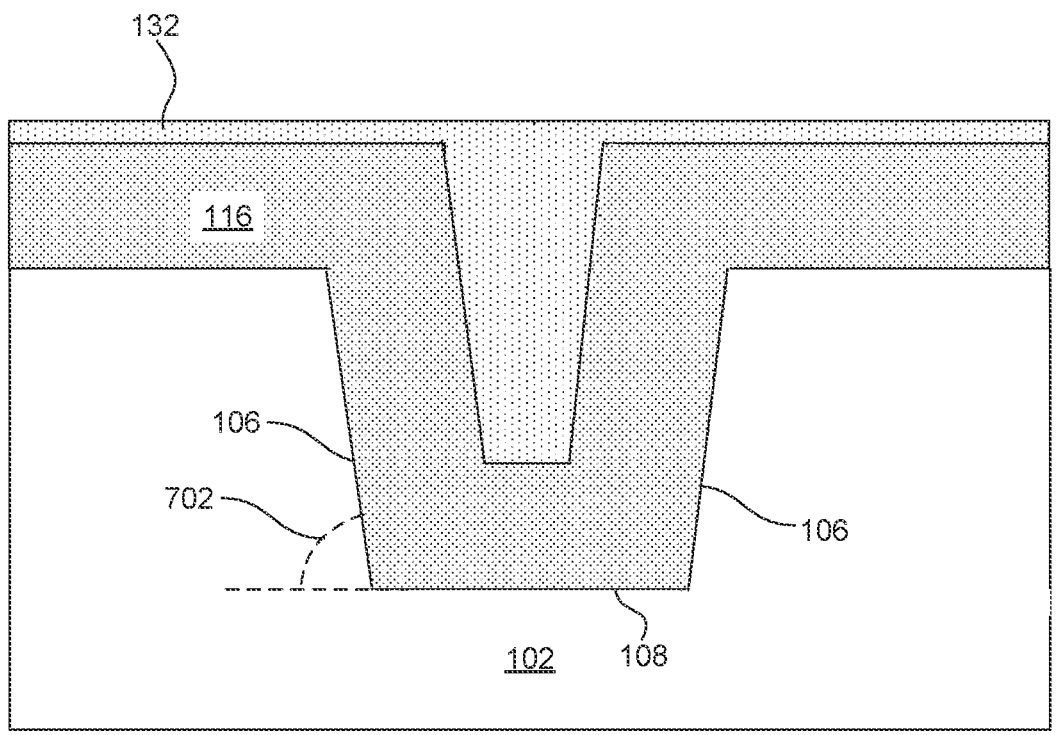
FIGS. 7A and 7B are diagrams showing a seamless gap fill with different angles, according to one example of principles described herein.
Figure 7B:
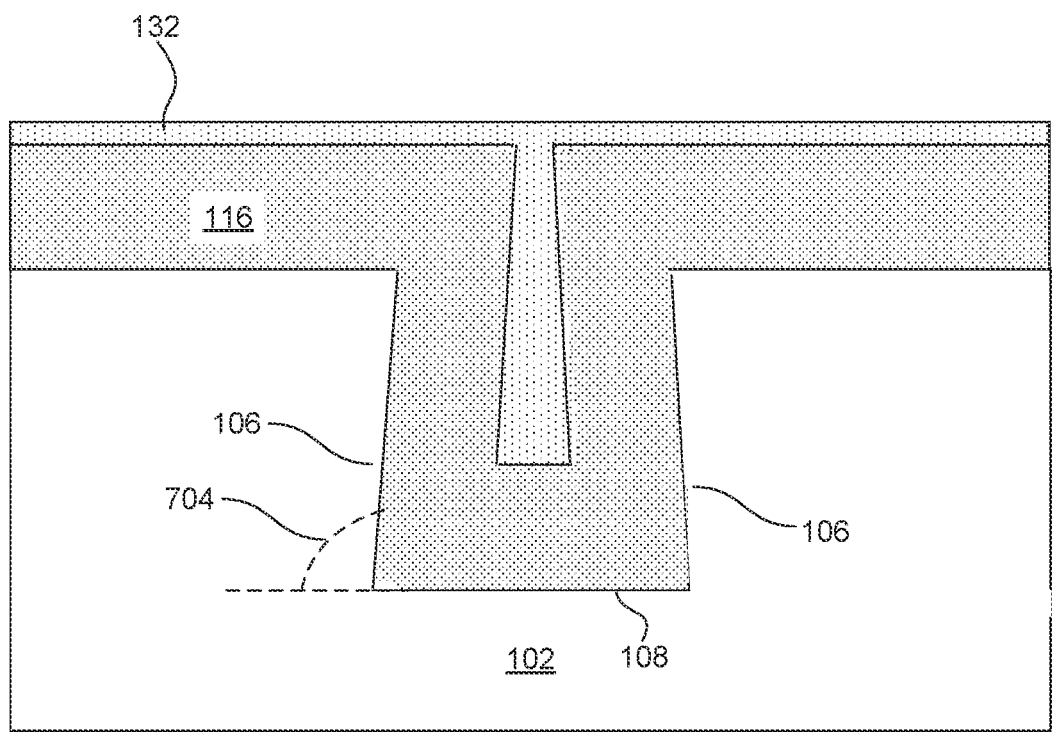

FIG. 7 is a diagram showing a seamless gap fill with different angles. FIG. 7A is a diagram showing an opening 104 that has sidewalls at an angle 702 within a range of 87-90 degrees. FIG. 7B is a diagram showing an opening 104 that has sidewalls at an angle 704 within a range of 90-93 degrees. Principles described herein may be used on sidewalls at other angles as well.

Figure 8:
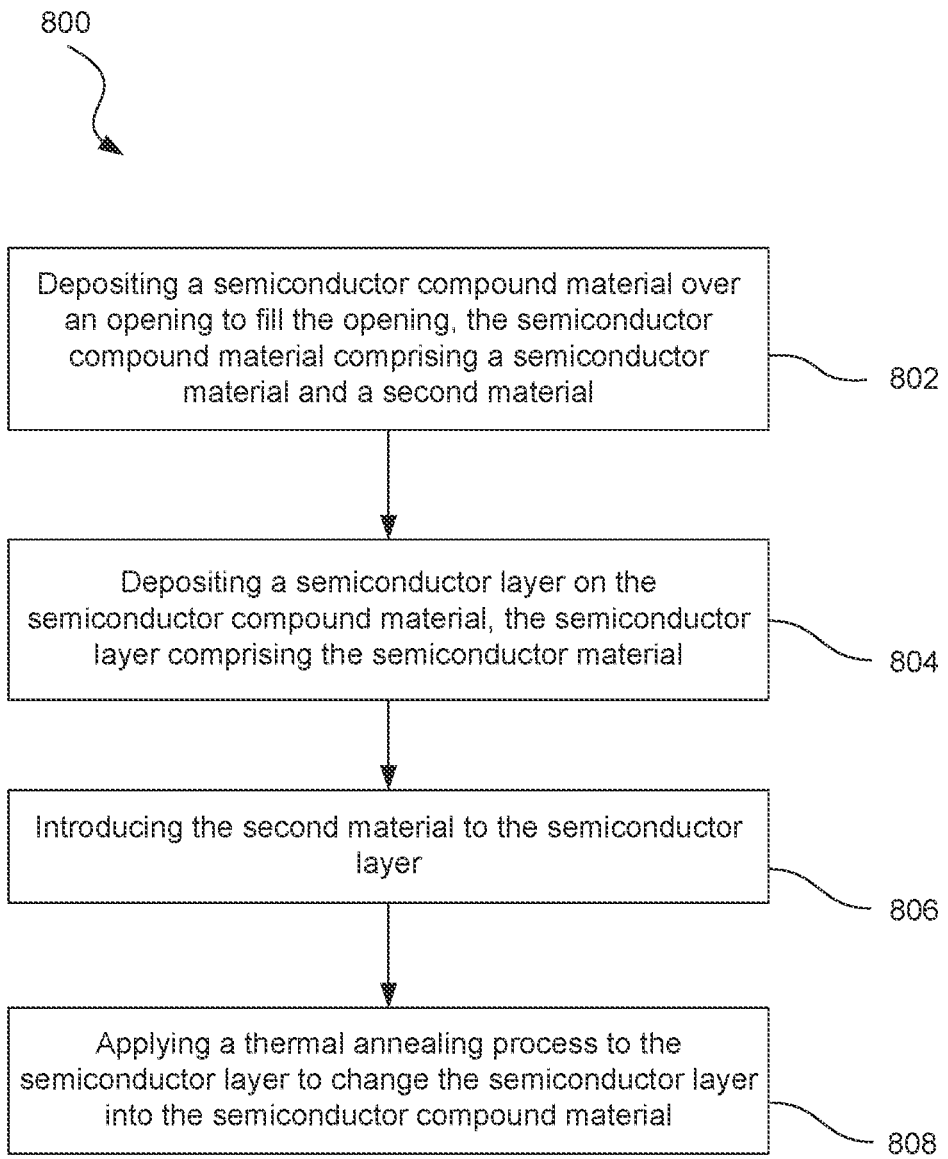
FIG. 8 is a flowchart showing an illustrative method for forming a seamless fill, according to one example of principles described herein.

FIG. 8 is a flowchart showing an illustrative method 800 for forming a seamless fill, according to one example of principles described herein. According to one example, a method includes a step 802 for depositing a first dielectric layer within an opening, the first dielectric layer comprising a semiconductor material and a second, non-semiconductor material. As described above, the opening may be, for example, a trench between fin structures. In such a case, the material used to fill the opening is used to form a Shallow Trench Isolation (STI) region. In some examples, the opening is a contact hole, in a dielectric material layer, used to expose an underlying feature such as a source/drain region or a gate structure. In one example, the opening has a width of approximately 20 nanometers. In some examples, the width is less than 20 nanometers. The aspect ratio (i.e., the ratio of height to width) may be approximately five. In some examples, the aspect ratio is greater than five. In one example, the angle between the bottom surface of the opening and the sidewall surfaces of the opening is within a range of about 87-93 degrees.

As described above, the first dielectric layer may include a semiconductor material such as silicon, germanium, or a III-V semiconductor material. The first dielectric layer also includes a second, non-semiconductor material such as oxygen or nitrogen that, when combined with the semiconductor material, forms a dielectric semiconductor compound. For example, the first dielectric layer maybe one of silicon nitride, silicon oxide, and silicon oxynitride. The semiconductor compound material may be deposited using one of a variety of techniques including, but not limited to, ALD and LPCVD. ALD involves a chemical reaction of precursors. Specifically, a substrate is exposed to alternating gaseous species to deposit thin layers of material onto a substrate. Another example of a deposition process that may be used is a Chemical Vapor Deposition (CVD) process such as a Low Pressure CVD (LPCVD) process. A CVD process also involves the use of precursors that are exposed to the substrate. A chemical reaction causes material to be deposited onto the substrate. An LPCVD process is performed at sub-atmospheric pressures.

As described above, deposition of the first dielectric layer may leave a gap near the center of the opening. The gap may have a width within a range of about 1 to 5 nanometers. This gap may be difficult to fill by continuing the deposition of the first dielectric layer. For example, continued deposition of the first dielectric layer may close the gap at the top, thus preventing further deposition at lower points. This may leave a space, or gap, within the center of the opening. It is desirable that this gap be filled.

According to the present example, the method 800 further includes a step 804 for depositing a semiconductor layer on the first dielectric layer, the semiconductor layer includes the same semiconductor material that is within the first dielectric layer. The semiconductor layer may be deposited using one of a variety of techniques including, but not limited to, ALD and LPCVD. The semiconductor layer consists of the same type of semiconductor material in the semiconductor compound material. For example, if the semiconductor compound material is silicon nitride, than the semiconductor layer consists of silicon. Deposition of the semiconductor layer may partially or fully fill the gap that remains after the deposition of the first dielectric layer.

According to the present example, the method 800 further includes a step 806 for introducing the second type of material to the semiconductor layer. For example, if the first dielectric layer is silicon nitride, then nitrogen is introduced into the semiconductor layer. If the first dielectric layer is silicon oxide, then oxygen is introduced into the semiconductor layer. If the first dielectric layer is silicon oxynitride, then both oxygen and nitrogen are introduced into the semiconductor layer.

Introducing the second type of material into the semiconductor layer may be done in one of a variety of manners. For example, as described above, the second type of material may be introduced through an implantation process. In one example, the implantation process may make the semiconductor layer an amorphous semiconductor layer. Unlike the original semiconductor layer which may have a crystal structure, the amorphous semiconductor layer has no such crystal structure. In other words, the implantation process breaks down the crystal structure of the semiconductor layer. This will aid the process of transforming the amorphous semiconductor layer into the first dielectric layer during the annealing process as will be described in further detail below.

Additionally or alternatively, the second material may be introduced by passing a gas over the semiconductor layer. For example, if the first dielectric layer is silicon nitride, then the gas may be a nitrogen gas ($N_2$). If the first dielectric layer is silicon oxide, and the gas may be an oxygen gas ($O_2$). If the first dielectric layer is silicon oxynitride, and the gas may include both oxygen and nitrogen gas.

According to the present example, the method 800 includes a step 808 for applying a thermal annealing process to the semiconductor layer to change the semiconductor layer into a second dielectric layer having the same elements as the first dielectric layer. The annealing process involves application of a high temperature for a set period of time. For example, the annealing process may involve the temperature greater than 950° C. for a period of at least 30 minutes. The annealing process causes the additional material introduced into the semiconductor layer to combine with the semiconductor layer to form the second dielectric layer. This creates additional dielectric material to fill the gap and create a single, seamless dielectric fill within the opening.

According to the present example, after the annealing process has been applied, the semiconductor layer has been transformed into the second dielectric layer such that a single semiconductor dielectric layer is formed. Thus, there is no gap in the center of the filled opening. Fabrication of the integrated circuit may then continue. For example, a CMP process may be used to remove portions of the first and second dielectric layer to expose the substrate. Then, an etching process may be used to partially remove the single semiconductor company material layer of the upper portion of the opening.

The embodiments of the present disclosure offer advantages over existing art, though it is understood that other embodiments may offer different advantages, not all advantages are necessarily discussed herein, and that no particular advantage is required for all embodiments. By utilizing the disclosed method, an opening (such as shallow trench in the substrate, a contact hole to source/drain, or a trench in the recessed gate) is effectively filled without a void. In other examples, the disclosed method is easy to implement, therefore the manufacturing cost is reduced and the manufacturing throughput is increased. Furthermore, there is no additional damage or concern.

According to one example, a method includes depositing a first dielectric layer in an opening, the first dielectric layer comprising a semiconductor element and a non-semiconductor element. The method further includes depositing a semiconductor layer on the first dielectric layer, the semiconductor layer comprising a first element that is the same as the semiconductor element. The method further includes introducing a second element to the semiconductor layer wherein the second element is the same as the non-semiconductor element. The method further includes applying a thermal annealing process to the semiconductor layer to change the semiconductor layer into a second dielectric layer.

According to one example, a method includes depositing a first silicon nitride (SiN layer) within an opening, depositing a silicon (Si) layer on the first SiN layer, introducing nitrogen (N) elements to the Si layer, and applying a thermal annealing process to the Si layer.

According to one example, a device includes an opening having a greater depth than width. The device further includes a first dielectric layer deposited on sidewalls and a bottom of the opening, the first dielectric layer comprising a semiconductor element and a non-semiconductor element, the first dielectric layer disposed such that there is a gap within a center of the opening. The device further includes a second dielectric layer disposed on the first dielectric layer and within the gap, the second dielectric layer comprising a first element that is the same as the semiconductor element and a second element that is the same as the non-semiconductor element. A ratio of the non-semiconductor element to the semiconductor element is greater than a ratio of the second element to the first element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin and a second fin disposed on a substrate;
a dielectric isolation structure disposed on the substrate and extending from the first fin to the second fin, the dielectric isolation structure including:
a first dielectric layer that includes a semiconductor material and a non-semiconductor material; and
a second dielectric layer that includes the semiconductor material and the non-semiconductor material, wherein a concentration of the non-semiconductor material in the second dielectric layer is highest in the center of the second dielectric layer.

2. The device of claim 1, wherein the semiconductor material includes a III-V semiconductor material, and
wherein the non-semiconductor material includes a material selected from the group consisting of oxygen and nitrogen.

3. The device of claim 1, wherein the concentration of the non-semiconductor material in the first dielectric layer is greater than the concentration of the non-semiconductor material in the second dielectric layer.

4. The device of claim 1, wherein at least a portion of the second dielectric layer is embedded within the first dielectric layer.

5. The device of claim 1, further comprising a gate structure disposed on the first fin and the second fin and interfacing with the dielectric isolation structure.

6. The device of claim 1, wherein a ratio of the non-semiconductor material to the semiconductor material in the first dielectric layer is about 4 to 3.

7. The device of claim 6, wherein a ratio of the non-semiconductor material to the semiconductor material in the second dielectric layer is less than the ratio of the non-semiconductor material to the semiconductor material in the first dielectric layer.

8. The device of claim 1, wherein the semiconductor material is selected from the group consisting of silicon and germanium.

9. A device comprising:

a first fin disposed on a substrate;

a dielectric isolation structure disposed on the substrate and interfacing with the first fin, the dielectric isolation structure including:

a first dielectric layer that includes a semiconductor material and a non-semiconductor material; and a second dielectric layer that includes the semiconductor material and the non-semiconductor material, wherein a concentration of the non-semiconductor material is less in the second dielectric layer than the first dielectric layer, and wherein the concentration of the non-semiconductor material in the second dielectric layer increases towards the center of the second dielectric layer.

10. The device of claim 9, wherein the semiconductor material includes silicon.

11. The device of claim 9, wherein the semiconductor material includes germanium.

12. The device of claim 9, wherein the first dielectric layer is thicker than then second dielectric layer.

13. The device of claim 9, wherein the dielectric isolation structure has a depth that is greater than a width of the dielectric isolation structure.

14. The device of claim 9, wherein the first dielectric layer is disposed between the substrate and the second dielectric layer such that the second dielectric layer is prevented from interfacing with the substrate by the first dielectric layer.

15. The device of claim 9, wherein the wherein the semiconductor material includes silicon and the non-semiconductor material includes nitrogen.

16. A device comprising:

a first fin and a second fin disposed on a substrate;

a shallow trench isolation structure disposed on the substrate and extending from the first fin to the second fin, the shallow trench isolation structure including:

a first dielectric layer having a semiconductor material and a non-semiconductor material, wherein the first dielectric layer has a substantially uniform concentration of the non-semiconductor material throughout the first dielectric layer; and a second dielectric layer disposed within the first dielectric layer such that the first dielectric layer interfaces with a first side of the second dielectric layer and a second side of the second dielectric layer, the second side being opposite the first side, wherein the non-semiconductor material in the second dielectric layer has a first concentration along the first side, a second concentration along the second side and a third concentration at a point positioned between the first side and the second side of the second dielectric layer, wherein the third concentration is higher than the first and second concentrations.

17. The device of claim 16, wherein the point is in the center of the second dielectric layer.

18. The device of claim 16, wherein the first concentration is the same as the second concentration.

19. The device of claim 16, wherein a ratio of the non-semiconductor material to the semiconductor material in the first dielectric layer is about 4 to 3, and wherein a ratio of the non-semiconductor material to the semiconductor material in the second dielectric layer is less than the ratio of the non-semiconductor material to the semiconductor material in the first dielectric layer.

20. The device of claim 16, wherein the non-semiconductor material includes oxygen and nitrogen.

* * * * *